US010063218B2

(12) United States Patent
Shen (10) Patent No.: US 10,063,218 B2
(45) Date of Patent: Aug. 28, 2018

(54) SCHMITT TRIGGER WITH THRESHOLD VOLTAGE CLOSE TO RAIL VOLTAGE

(71) Applicant: Cirrus Logic, Inc., Austin, TX (US)

(72) Inventor: Dan Shen, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 617 days.

(21) Appl. No.: 14/270,296

(22) Filed: May 5, 2014

(65) Prior Publication Data

US 2015/0318844 A1    Nov. 5, 2015

(51) Int. Cl.
*H03F 99/00* (2009.01)
*H03K 3/037* (2006.01)
*H03F 3/217* (2006.01)
*H03K 3/3565* (2006.01)

(52) U.S. Cl.
CPC ........... *H03K 3/0377* (2013.01); *H03F 3/217* (2013.01); *H03F 3/2171* (2013.01); *H03F 3/2173* (2013.01); *H03K 3/3565* (2013.01)

(58) Field of Classification Search
CPC ...... H03F 3/127; H03F 3/2175; H03F 3/2178; H03F 3/2171; H03F 3/2173; H03F 3/217
USPC .................. 330/127, 251, 257; 381/120, 123
See application file for complete search history.

(56) References Cited

U.S. PATENT DOCUMENTS 6,448,851 B1    9/2002    McIntosh et al.
7,911,255 B2 *  3/2011    Ochi ..................... H03F 3/2173
                                                         323/312
2009/0140796 A1  6/2009    Wong et al.
2011/0279179 A1* 11/2011   Vice ........................ H03G 3/007
                                                         330/127
2014/0333378 A1* 11/2014   Karthaus ............... H03F 3/2171
                                                         330/251

FOREIGN PATENT DOCUMENTS

WO    2008101548 A1    8/2008
WO    2015171525 A1    11/2015

OTHER PUBLICATIONS

Parviz, Amiri et al., Low Distortion CMOS Class-D Amplifier with Double-Band Hysteresis, IEICE Electronics Express, vol. 7, No. 4, Jan. 1, 2010, pp. 273-280.

* cited by examiner

*Primary Examiner* — Disler Paul
(74) *Attorney, Agent, or Firm* — Jackson Walker L.L.P.

(57) ABSTRACT

Voltage level shifting in a switching output stage is presented. The circuit may include a switching output stage configured to receive an analog input signal and provide a responsive digital output signal, the switching output stage having a first switching device coupled to a first supply voltage and a second switching device coupled to a second supply voltage, the first switching device and the second switching device being coupled to a common output node. The apparatus may also include a voltage level shifter circuit coupled to a switching control node of the second switching device, the voltage level shifter configured to shift a voltage level at the switching control node of the second switching device relative to the analog input signal, wherein the digital output signal at the common output node transitions as the input signal reaches a predetermined threshold value.

28 Claims, 6 Drawing Sheets

SCHMITT TRIGGER WITH THRESHOLD VOLTAGE CLOSE TO RAIL VOLTAGE

FIELD

This disclosure relates generally to a Schmitt trigger circuit, more specifically, a Schmitt trigger circuit that has one of its threshold voltage very close to rail voltages

BACKGROUND

Switching amplifiers are common for many different applications, such as pulse generators. One application for a switching amplifier is in the audio field. Often a switching amplifier is used as an Analog-to-Digital Converter (ADC), or as a digital signal driver for an acoustic device, such as a speaker. One type of switching amplifier is commonly referred to as a class-D amplifier. Although various embodiments described herein may be discussed with relation to a class-D amplifier, one of ordinary skill will recognize that the embodiments may be equally useful with other switching amplifier configurations.

A class-D amplifier is an electronic amplifier where internal power devices, such as Metal-On-Silicon Field-Effect-Transistors (MOSFETs), are operated as binary switches. The MOSFETs are often driven to be either fully on or fully off. Ideally, zero time is spent transitioning between those two states. Class D amplifiers work by generating a variable duty cycle square wave of which the low-frequency portion of the spectrum nearly resembles the desired output signal, and of which the high-frequency portion serves no purpose other than to make the waveform binary so it can be amplified by switching the power devices.

The switching amplifier often includes a PMOS transistor and an NMOS transistor. The PMOS and the NMOS may switch on and off respectively to provide the switching output. Switching from one MOS to another needs to be done carefully so that direct current from PMOS to NMOS should be minimized, and the non-overlap time during which both PMOS and NMOS are off should also be minimized. It is also well known that electromagnetic interference (EMI) related to class D amplifier can be alleviated by slowing down the output slew rate.

To accurately control the PMOS and NMOS in a class D amplifier in a manner described above, it is desirable to use the amplifier output as feedback to control the slew rate. Specifically, it is desirable to drive the gate of the power transistors with a weak strength during the transition of output, but once output finishes its transition, it is desired to drive the gate of the power transistors with full force so that the overshoot, undershoot and energy loss all can be minimized. As used herein, a "weak" strength MOSFET may include a device that is small in physical dimensions relative to its complimentary device, or a device with lower charge-carrier mobility characteristics relative to its complimentary device. Prior art of using just a skewed inverter or conventional Schmitt trigger often cannot accurately control or robustly set the threshold voltage very close to the rail voltage, which is where the switching truly finishes.

SUMMARY

Embodiments of systems, apparatuses, and methods for implementing a Schmitt trigger with threshold voltage close to rail voltage are presented. In an embodiment, the apparatus includes a switching output stage configured to receive an analog input signal and provide a responsive digital output signal, the switching output stage having a first switching device coupled to a first supply voltage and a second switching device coupled to a second supply voltage, the first switching device and the second switching device being coupled to a common output node. The apparatus also includes a voltage level shifter circuit coupled to a switching control node of the second switching device, the voltage level shifter configured to shift a voltage level at the switching control node of the second switching device relative to the input signal, wherein the digital output signal at the common output node transitions as the input signal reaches a predetermined threshold value that is very close to rail voltage. Additionally, the apparatus may include a third switching device and a fourth switching device for implementing hysteresis in the apparatus. Beneficially, such embodiments may shift the threshold of this Schmitt trigger toward the rail voltage. When the output of a class D amplifier is connected to the input of the embodiments of this Schmitt trigger, the exact moment when the class D amplifier finishes switching can be sensed. Therefore, overshoot and/or undershoot of the class D output can be reduced and the performance of the class D amplifier can be improved.

In an embodiment, the first supply voltage is higher than the second supply voltage. In such an embodiment, the voltage level shifter may shift the input signal up by a predetermined shift value. Thus, the predetermined threshold value is shifted toward the second supply voltage.

In another embodiment, the first supply voltage is lower than the second supply voltage. In such an embodiment, the voltage level shifter is configured to shift the input signal down by a predetermined shift value, and thus the predetermined threshold voltage is shifted toward the second supply voltage.

In one embodiment, the second switching device is stronger than the first switching device. As used herein a "strong" strength MOSFET may include a device that is large in physical dimensions relative to its complimentary device, or a device with higher charge-carrier mobility characteristics relative to its complimentary device. In another embodiment, a current supply drives the source node of the first switching device.

In an embodiment, the voltage level shifter includes a first diode and a second diode, wherein an anode of the first diode is coupled to the input signal and a cathode of the first diode is coupled to the switching control node of the second switching device, and wherein an anode of the second diode is coupled to the switching control node of the second switching device and a cathode of the second diode is coupled to the input signal.

In another embodiment, the voltage level shifter includes a first level shifter transistor, wherein a drain node and a gate node of the first level shifter transistor are coupled to the input signal, and a source node of the level shifter transistor is coupled to the switching control node of the second switching device, and a second level shifter transistor, wherein a source node of the second level shifter transistor is coupled to the input signal, and a drain node and a gate node of the second level shifter transistor are coupled to the switching control node of the second switching device.

A method is also presented. In an embodiment, the method includes receiving, in a switching output stage, an analog input signal. The method may also include generating a responsive digital output signal to a common output node of the switching output stage, the switching output stage having a first switching device coupled to a first supply voltage and a second switching device coupled to a second supply voltage, the first switching device and the second switching device being coupled to the common output node. Additionally, the method may include shifting a voltage level at a switching control node of the second switching device relative to the input signal with a voltage level shifter circuit coupled to the switching control node of the second switching device, wherein the digital output signal at the common output node transitions as the input signal reaches a predetermined threshold value that is close to rail voltage.

A system is also presented. In an embodiment, the system includes an acoustical driver configured to convert an electrical signal into acoustical energy. Additionally, the system may include a signal driver coupled to the acoustical driver. The signal driver may include a switching output stage configured to receive an analog input signal and provide a responsive digital output signal, the switching output stage having a first switching device coupled to a first supply voltage and a second switching device coupled to a second supply voltage, the first switching device and the second switching device being coupled to a common output node. Additionally, the signal driver may include a voltage level shifter circuit coupled to a switching control node of the second switching device, the voltage level shifter configured to shift a voltage level at the switching control node of the second switching device relative to the input signal, wherein the digital output signal at the common output node transitions as the input signal reaches a predetermined threshold value.

BRIEF DESCRIPTION OF THE DRAWINGS

The present disclosure is illustrated by way of example and is/are not limited by the accompanying figures, in which like references indicate similar elements. Elements in the figures are illustrated for simplicity and clarity and have not necessarily been drawn to scale.

DETAILED DESCRIPTION

The present embodiments provide for implementing a Schmitt trigger with threshold voltage close to rail voltage. Embodiments of systems, apparatuses, and methods are described. Such embodiments may shift an input signal level on one of the switching devices such that the switching device turns on closer to the voltage rail coupled to the switching device. For example, if the threshold of the Schmitt trigger is desired to be close to ground, then embodiment of this Schmitt trigger may include a weak PMOS transistor and a strong NMOS transistor, then the gate of the NMOS transistor may be coupled to the output of the level shifting circuit which shifts the input voltage up such that the NMOS transistor only switches off when the input signal is relatively close to ground. Since the NMOS transistor is much stronger than PMOS transistor, output will only toggle when the NMOS is fully turned off. Therefore, the threshold voltage in terms of input when output starts to toggle is shifted down. Beneficially, such embodiments may shift the threshold toward the rail voltage. When the output of a class D amplifier is connected to the input of the embodiments of this Schmitt trigger, the exact moment when the class D amplifier finishes switching can be sensed. Therefore, overshoot and/or undershoot of the class D output can be reduced and the performance of the class D amplifier can be improved.

Figure 1:
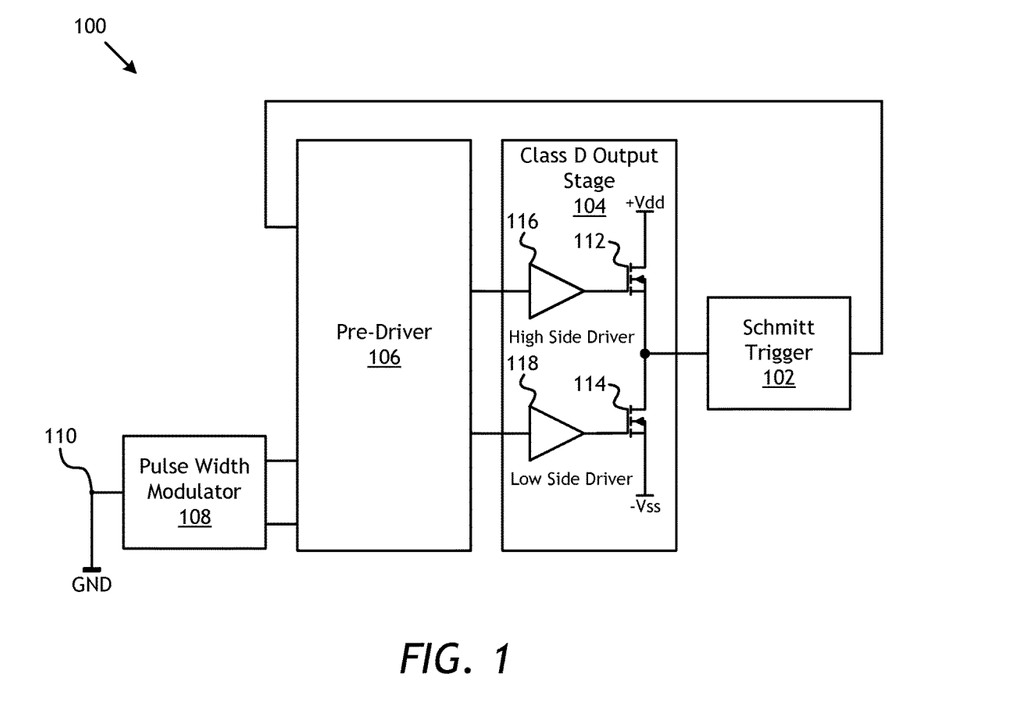
FIG. 1 is a schematic block diagram illustrating one embodiment of a system having a Schmitt trigger with threshold voltage close to rail voltage.

FIG. 1 is a schematic block diagram illustrating one embodiment of a system 100 for implementing a Schmitt trigger with threshold voltage close to rail voltage. In an embodiment, the system 100 includes a Schmitt trigger device 102. The system 100 may also include a class D output stage 104. In an example embodiment, the class D output stage 104 may include a first transistor and a second transistor coupled to a high and low voltage rail+Vdd. Additionally, each transistor may be driven by a pre-driver 106. The class D output stage 104 may receive an input signal from a pulse width modulator 108 which receives an input signal 110. The Schmitt trigger circuit 102 may capture the moment when the output class D output stage 104 finishes switching from one rail voltage to the other rail voltage. The pre-driver 106 may use the output of the Schmitt trigger 102 to adjust the slew rate for the gate of the transistors in the class D output stage 104. One of ordinary skill will recognize alternative embodiments of a system 100 that may be used in association with the present embodiments.

Figure 2:
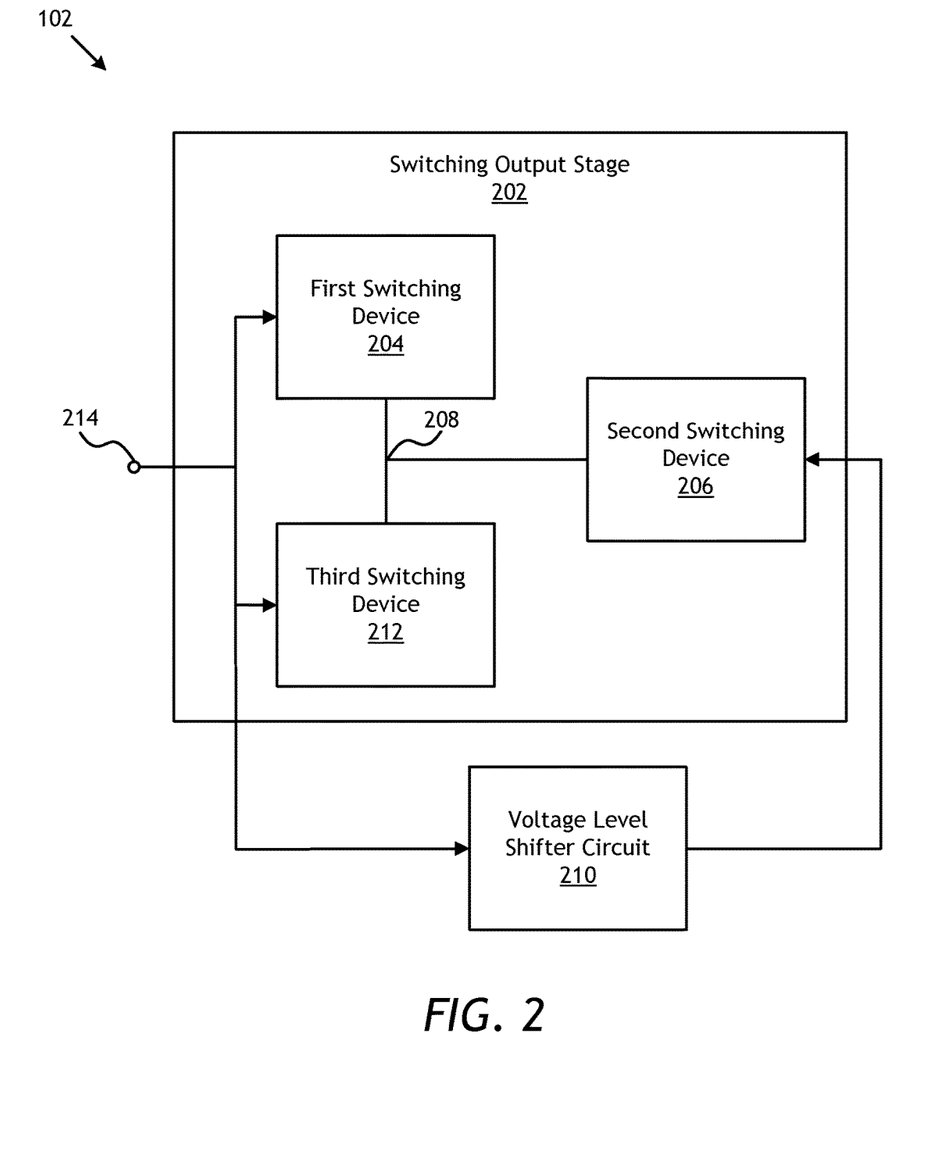
FIG. 2 is a schematic block diagram illustrating one embodiment of an apparatus having a Schmitt trigger with threshold voltage close to rail voltage.

FIG. 2 is a schematic block diagram illustrating one embodiment of a Schmitt trigger 102 with threshold voltage close to rail voltage. Circuit 200 may comprise an embodiment of the Schmitt trigger device 102 described in FIG. 1. In an embodiment, the circuit 200 includes a switching output stage 202. The switching output stage 202 may include a first switching device 204 and a second switching device 206, each sharing a common output node 208. The second switching device 206 may be much stronger than the first switching device 204. In an embodiment, the second switching device 206 may be coupled to the voltage level shifter circuit 210. The voltage level shifter circuit 210 may be configured to shift a voltage level at a switching control node of the second switching device 206 relative to an input signal 214. For example, the voltage level shifter circuit 210 may shift the input signal 214 by a voltage level that is very close to the threshold voltage of the second switching device 206. In such an embodiment, the voltage level shifter circuit 210 may cause the digital output signal at the common output node 208 to transition as the input signal reaches a predetermined threshold, which is very close to ground. The third switching device 212 may provide hysteresis in the circuit 200. Further examples of the structure and functions of the voltage level shifter circuit 210 are described in FIGS. 3-5.

Figure 3:
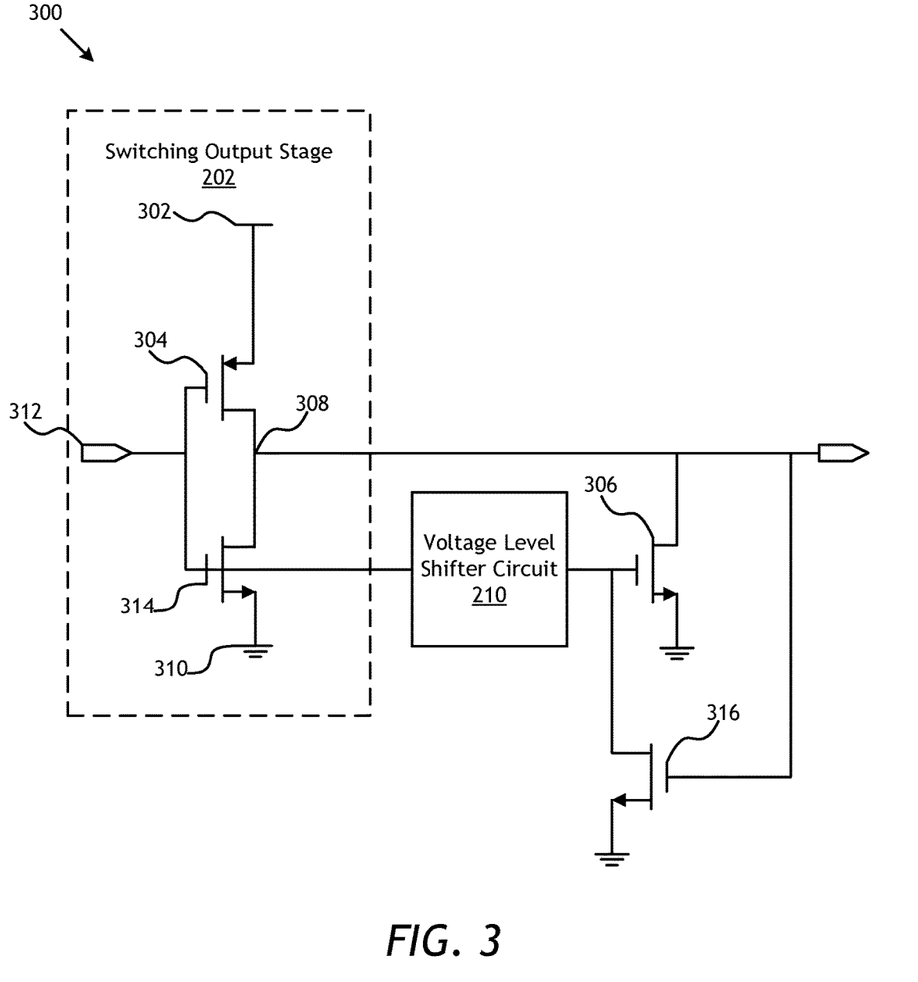
FIG. 3 is a schematic block diagram illustrating another embodiment of an apparatus having a Schmitt trigger with threshold voltage close to rail voltage.

FIG. 3 is a schematic block diagram illustrating another embodiment of a circuit 300 for implementing a Schmitt trigger with threshold voltage close to rail voltage. In one embodiment, the circuit 300 may be used as Schmitt trigger device 102. In an embodiment, the circuit 300 includes a switching output stage 202 and a voltage level shifter circuit 210 as described in FIG. 2. In a further embodiment of the circuit 300, the switching output stage 202 includes a first voltage rail 302, and a second voltage rail 310. In the illustrated embodiment, the first voltage rail is Vdd, which may be a positive voltage supply, and the second voltage rail 310 may be ground. In a particular embodiment, the first voltage rail 302 may be at a higher magnitude potential level than the second voltage rail 310.

In an embodiment, the first switching device 204 for circuit 300 may be a first transistor device 304. Similarly, the second switching device 206 for circuit 300 may be a second transistor device 306. Additionally, the third switching device 214 for circuit 300 may be a third transistor device 314. In a further embodiment, the first transistor 304 and the second transistor 306 may be a Complimentary MOSFET pair, where the first transistor 304 is a PMOS device and the second transistor 306 is an NMOS device. In particular, the second transistor 306 may be much stronger than the first transistor device 304. In such an embodiment, the common output node 308 may be coupled to the drain node of each of the first transistor 304 and the second transistor 306. Additionally, an input signal may be received on input line 312 and coupled to a control node, such as the gate node, of each of the first transistor 304 and the third transistor 314. The gate node of the second transistor 306 may be coupled to the voltage level shifter circuit 210.

The voltage level shifter circuit 210 may be coupled to the common output node 308 as well as the input line 312. In a further embodiment, the voltage level shifter circuit 210 may be coupled between the input node 312 and the control or gate node of the second transistor 306, which may be an NMOS transistor in some embodiments. According to one embodiment, the voltage level shifter circuit 210 may shift the voltage level up at the gate node of the second transistor 306 such that the transistor is configured to switch off when the voltage at the input signal 312 is closer to ground than would be the case without the voltage shifting. For example, if the second transistor 306 has a threshold voltage (Vth) of 0.6 V, then the voltage level shifter circuit 210 may shift the input signal 312 up by around 0.6 V. In some embodiments, the voltage level shifter circuit 210 may shift the voltage of the input signal 312 up by about 0.1 V, 0.2 V, 0.3 V, 0.4 V, or 0.5 V. One of ordinary skill will recognize that the voltage level shifter circuit may shift the input signal more or less within the range of 0V-0.6 V, depending upon system configurations or performance requirements. In a further embodiment, the circuit 300 may include a third transistor 314 and a fourth transistor 316 configured to provide hysteresis. When the input 312 transitions from high to low, the third transistor 314 may be turned off when the input signal 312 reaches just below the NMOS threshold voltage, while the second transistor 306 still remains on. Therefore, the threshold voltage of the circuit 300 is decided by the level shifter 210 and the second transistor 306. Once the common output 308 changes from low to high, the fourth transistor 316 will turn on and strongly shut off the second transistor 306. When the input 312 transitions start to change from low to high, initially output 308 and the fourth transistor 316 will keep the second transistor fully shut off, and the common output will be held high until the input reaches the NMOS threshold voltage to turn on the third transistor 312. Therefore, the threshold for circuit 300 is very close to ground when the input transitions from high to low and the threshold is close to the NMOS threshold when input transitions from low to high.

Figure 4:
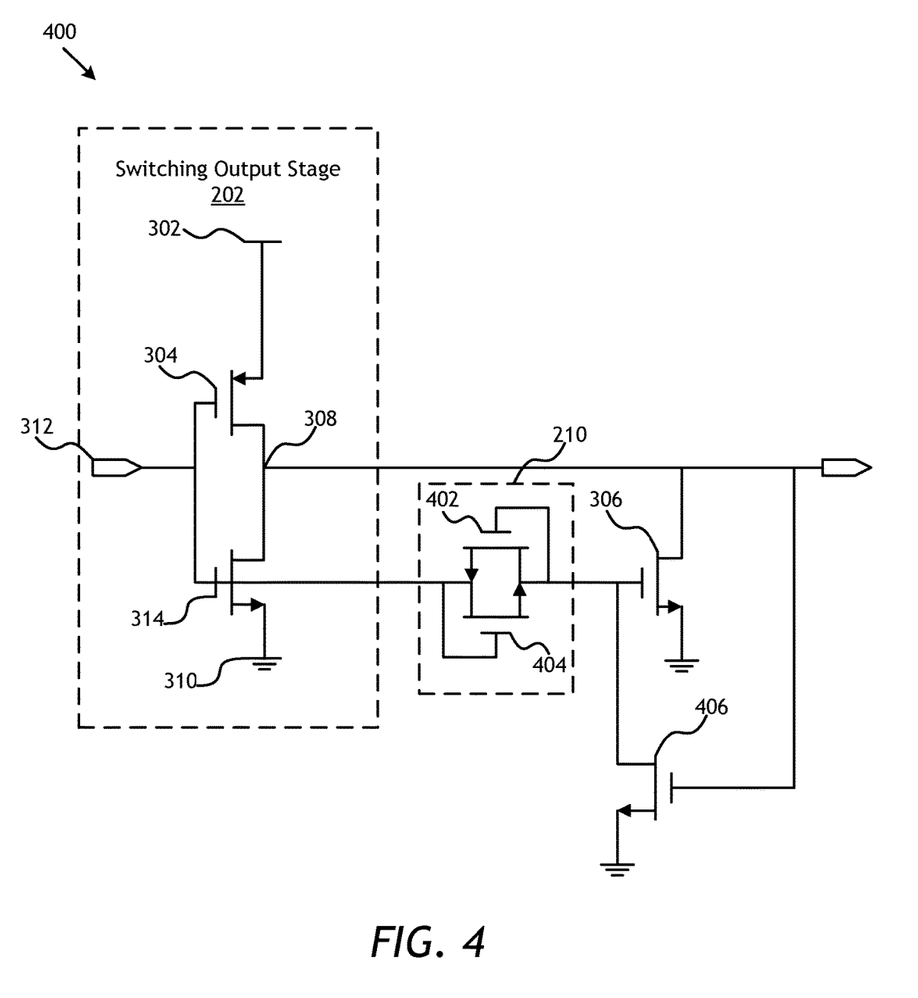
FIG. 4 is a schematic block diagram illustrating another embodiment of an apparatus having a Schmitt trigger with threshold voltage close to rail voltage.

FIG. 4 is a schematic block diagram illustrating another embodiment of a circuit 400 for implementing a Schmitt trigger with threshold voltage close to rail voltage. In one embodiment, the circuit 400 may be used as Schmitt trigger device 102 as shown in FIG. 1. In an embodiment, the circuit 400 includes the switching output stage 202 as described in FIG. 3. The circuit 400 may also include a voltage level shifter circuit 210. In the depicted embodiment, the voltage level shifter circuit 210 may include a diode or transistor 402 and a second diode or transistor 404 arranged in a back-to-back or source-to-drain configuration.

For example, a drain node and a gate node of the first level shifter transistor 402 are coupled to the gate node of the second transistor 306, and a source node of the level shifter transistor 402 is coupled to the input signal 312. A second level shifter transistor 404 is arranged such that a gate node and a drain node of the second level shifter transistor 404 is coupled to the input signal 312, and a source node of the transistor of second level shifter 404 is coupled to the switching control node (e.g., gate node) of the second transistor 306.

Figure 5:
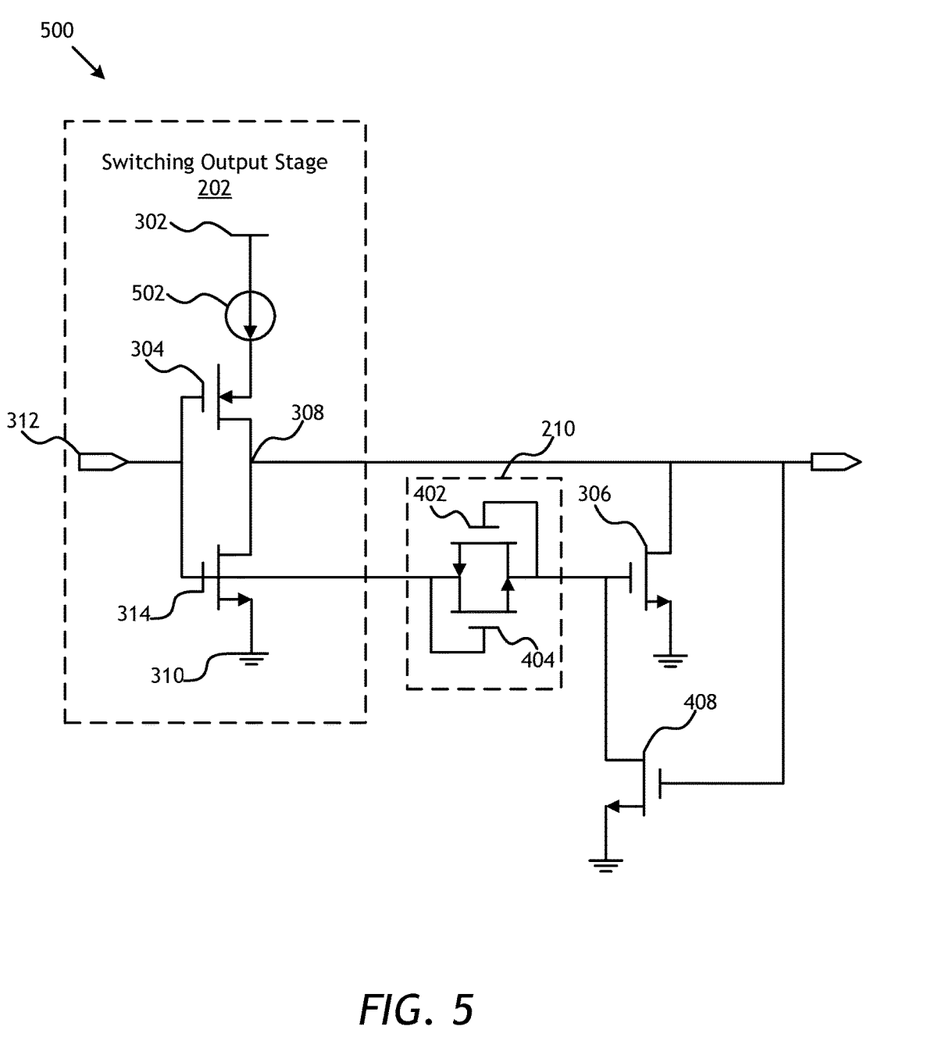
FIG. 5 is a schematic block diagram illustrating another embodiment of an apparatus having a Schmitt trigger with threshold voltage close to rail voltage.

FIG. 5 is a schematic block diagram illustrating another embodiment of a circuit 500 for implementing a Schmitt trigger with threshold voltage close to rail voltage. In one embodiment, the circuit 500 may be used as Schmitt trigger device 102. The circuit 500 of FIG. 5 is similar in structure and function to the circuit 400 of FIG. 4; however, the first switching transistor 304 is coupled to a current source 502 configured to drive a small constant current $I_1$ to the source node of the first transistor 304 so that the driving force of the first transistor 304 is limited by the small current provided by current source 502.

Figure 6:
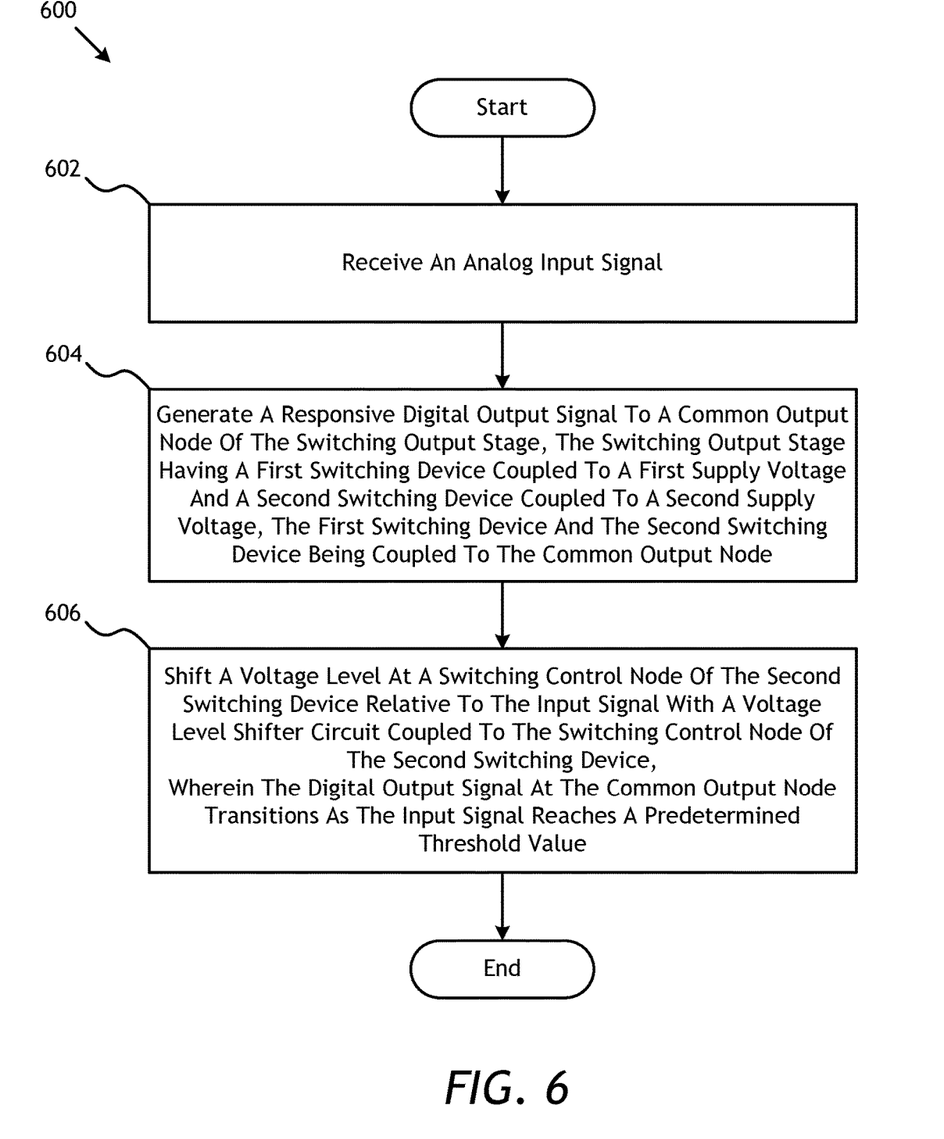
FIG. 6 is a flowchart diagram illustrating one embodiment of a method for implementing a Schmitt trigger with threshold voltage close to rail voltage.

It should be understood that the various operations described herein, particularly in connection with FIG. 6, may be implemented by processing circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

FIG. 6 is a flowchart diagram illustrating one embodiment of a method 600 for voltage level shifting in a switching output stage of a signal amplifier. In an embodiment, the method 600 includes receiving an analog input signal at the input node 308 as shown at block 602. The switching output stage 202 may generate a responsive digital output signal to a common output node 208 of the switching output stage 202, as shown at block 604. In an embodiment, the switching output stage 202 has a first switching device 204 coupled to a first supply voltage 302 and a second switching device 206 coupled to a second supply voltage 310. The first switching device 204 and the second switching device 206 may be coupled to the common output node 208. As shown at block 606, the voltage level shifter circuit 210 may shift a voltage level at a switching control node of the second switching device 206 relative to the input signal 308. In an embodiment, the digital output signal at the common output node 208 transitions as the input signal 312 reaches a predetermined threshold value.

Although this disclosure makes reference to specific embodiments, certain modifications and changes can be made to those embodiments. Accordingly, the specification and figures are to be regarded in an illustrative rather than a restrictive sense, and all such modifications are intended to be included within the scope of this disclosure. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An apparatus, comprising:
   a switching output stage configured to receive an analog input signal and provide a responsive digital output signal, the switching output stage having a first switching device coupled to a first supply voltage and a second switching device coupled to a second supply voltage, the first switching device and the second switching device being coupled to a common output node; and
   a voltage level shifter circuit coupled to a switching control node of the second switching device, the voltage level shifter configured to shift a voltage level at the switching control node of the second switching device relative to the analog input signal;
   wherein the digital output signal at the common output node transitions as the analog input signal reaches a predetermined threshold value.

2. The apparatus of claim 1, wherein the first supply voltage is higher than the second supply voltage.

3. The apparatus of claim 2, wherein the voltage level shifter is configured to shift the analog input signal up by a predetermined shift value and wherein the predetermined threshold value is shifted toward the second supply voltage.

4. The apparatus of claim 1, wherein the first supply voltage is lower than the second supply voltage.

5. The apparatus of claim 4, wherein the voltage level shifter is configured to shift the analog input signal down by a predetermined shift value and wherein the predetermined threshold voltage is shifted toward the second supply voltage.

6. The apparatus of claim 1, wherein the second switching device is stronger than the first switching device.

7. The apparatus of claim 1, wherein the voltage level shifter comprises a first diode and a second diode, wherein an anode of the first diode is coupled to the input signal and a cathode of the first diode is coupled to the switching control node of the second switching device, and wherein an anode of the second diode is coupled to the switching control node of the second switching device and a cathode of the second diode is coupled to the analog input signal.

8. The apparatus of claim 1, wherein the voltage level shifter comprises:
   a first level shifter transistor, wherein a source node and a gate node of the first level shifter transistor are coupled to the analog input signal, and a drain node of the level shifter transistor is coupled to the switching control node of the second switching device; and
   a second level shifter transistor, wherein a drain node of the second level shifter transistor is coupled to the analog input signal, and a source node and a gate node of the second level shifter transistor are coupled to the switching control node of the second switching device.

9. The apparatus of claim 1, further comprising a third switching device having a control node coupled to the input signal, wherein the third switching device is coupled between the second power supply and the common output.

10. The apparatus of claim 1, further comprising a fourth switching device having a control node coupled to the common output node, wherein the fourth switching device is coupled between a control node of the second switching device and the second power supply.

11. A method, comprising:
   receiving, in a switching output stage, an analog input signal;
   generating a responsive digital output signal to a common output node of the switching output stage, the switching output stage having a first switching device coupled to a first supply voltage and a second switching device coupled to a second supply voltage, the first switching device and the second switching device being coupled to the common output node; and
   shifting a voltage level at a switching control node of the second switching device relative to the analog input signal with a voltage level shifter circuit coupled to the switching control node of the second switching device;
   wherein the digital output signal at the common output node transitions as the analog input signal reaches a predetermined threshold value.

12. The method of claim 11, wherein the first supply voltage is higher than the second supply voltage.

13. The method of claim 12, wherein the voltage level shifter is configured to shift the analog input signal up by a predetermined shift value and wherein the predetermined threshold value is shifted toward the second supply voltage.

14. The method of claim 11, wherein the first supply voltage is lower than the second supply voltage.

15. The method of claim 14, wherein the voltage level shifter is configured to shift the analog input signal down by a predetermined shift value and wherein the predetermined threshold voltage is shifted toward the second supply voltage.

16. The method of claim 11, wherein the second switching device is stronger than the first switching device.

17. The method of claim 11, wherein the voltage level shifter comprises a first diode and a second diode, wherein an anode of the first diode is coupled to the input signal and a cathode of the first diode is coupled to the switching control node of the second switching device, and wherein an anode of the second diode is coupled to the switching control node of the second switching device and a cathode of the second diode is coupled to the input signal.

18. The method of claim 11, wherein the voltage level shifter comprises:
   a first level shifter transistor, wherein a source node and a gate node of the first level shifter transistor are coupled to the input signal, and a drain node of the level shifter transistor is coupled to the switching control node of the second switching device; and a second level shifter transistor, wherein a drain node of the second level shifter transistor is coupled to the input signal, and a source node and a gate node of the second level shifter transistor are coupled to the switching control node of the second switching device.

19. A system, comprising:
an acoustical driver configured to convert an electrical signal into acoustical energy; and
a signal driver coupled to the acoustical driver, the signal driver comprising:
  a switching output stage configured to receive an analog input signal and provide a responsive digital output signal, the switching output stage having a first switching device coupled to a first supply voltage and a second switching device coupled to a second supply voltage, the first switching device and the second switching device being coupled to a common output node; and
  a voltage level shifter circuit coupled to a switching control node of the second switching device, the voltage level shifter configured to shift a voltage level at the switching control node of the second switching device relative to the analog input signal;
  wherein the digital output signal at the common output node transitions as the analog input signal reaches a predetermined threshold value.

20. The system of claim 19, wherein the first supply voltage is higher than the second supply voltage.

21. The system of claim 20, wherein the voltage level shifter is configured to shift the analog input signal up by a predetermined shift value and wherein the predetermined threshold value is shifted toward the second supply voltage.

22. The system of claim 19, wherein the first supply voltage is lower than the second supply voltage.

23. The system of claim 22, wherein the voltage level shifter is configured to shift the analog input signal down by a predetermined shift value and wherein the predetermined threshold voltage is shifted toward the second supply voltage.

24. The system of claim 19, wherein the second switching device is stronger than the first switching device.

25. The system of claim 19, wherein the voltage level shifter comprises a first diode and a second diode, wherein an anode of the first diode is coupled to the input signal and a cathode of the first diode is coupled to the switching control node of the second switching device, and wherein an anode of the second diode is coupled to the switching control node of the second switching device and a cathode of the second diode is coupled to the analog input signal.

26. The system of claim 19, wherein the voltage level shifter comprises:
  a first level shifter transistor, wherein a source node and a gate node of the first level shifter transistor are coupled to the analog input signal, and a drain node of the level shifter transistor is coupled to the switching control node of the second switching device; and
  a second level shifter transistor, wherein a drain node of the second level shifter transistor is coupled to the analog input signal, and a source node and a gate node of the second level shifter transistor are coupled to the switching control node of the second switching device.

27. The system of claim 19, further comprising a third switching device having a control node coupled to the input signal, wherein the third switching device is coupled between the second power supply and the common output.

28. The system of claim 19, further comprising a fourth switching device having a control node coupled to the common output node, wherein the fourth switching device is coupled between a control node of the second switching device and the second power supply.

* * * * *